(12) United States Patent
Park et al.

(10) Patent No.: US 11,949,012 B2
(45) Date of Patent: *Apr. 2, 2024

(54) SEMICONDUCTOR DEVICE

(71) Applicant: SAMSUNG ELECTRONICS CO., LTD., Suwon-si (KR)

(72) Inventors: Jong Ho Park, Suwon-si (KR); Wan Don Kim, Seongnam-si (KR); Weon Hong Kim, Suwon-si (KR); Hyeon Jun Baek, Hwaseong-si (KR); Byoung Hoon Lee, Suwon-si (KR); Jeong Hyuk Yim, Seoul (KR); Sang Jin Hyun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/114,598

(22) Filed: Dec. 8, 2020

(65) Prior Publication Data

US 2021/0119058 A1 Apr. 22, 2021

Related U.S. Application Data

(63) Continuation of application No. 16/451,787, filed on Jun. 25, 2019, now Pat. No. 10,879,392.

(30) Foreign Application Priority Data

Jul. 5, 2018 (KR) .................. 10-2018-0078126
Jan. 7, 2019 (KR) .................. 10-2019-0001698

(51) Int. Cl.
*H01L 29/78* (2006.01)
*H01L 27/088* (2006.01)
(Continued)

(52) U.S. Cl.
CPC .... *H01L 29/78391* (2014.09); *H01L 27/0886* (2013.01); *H01L 29/4966* (2013.01); *H01L 29/516* (2013.01)

(58) Field of Classification Search
None
See application file for complete search history.

(56) References Cited

U.S. PATENT DOCUMENTS 8,673,758 B2   3/2014  Ma et al.
8,785,995 B2   7/2014  Dubourdieu et al.
(Continued)

FOREIGN PATENT DOCUMENTS

CN    105023944    3/2018
JP    2009-278083  11/2009
(Continued)

OTHER PUBLICATIONS

Indian Office Action issued in corresponding Indian Patent Appln No. 201924026649 dated Jan. 28, 2021.
(Continued)

*Primary Examiner* — Khaja Ahmad
(74) *Attorney, Agent, or Firm* — F. Chau & Associates, LLC

(57) ABSTRACT

A semiconductor device including: a first transistor which include a first gate stack on a substrate; and a second transistor which includes a second gate stack on the substrate, wherein the first gate stack includes a first ferroelectric material layer disposed on the substrate, a first work function layer disposed on the first ferroelectric material layer and a first upper gate electrode disposed on the first work function layer, wherein the second gate stack includes a second ferroelectric material layer disposed on the substrate, a second work function layer disposed on the second ferroelectric material layer and a second upper gate elec-
(Continued)

trode disposed on the second work function layer, wherein the first work function layer includes the same material as the second work function layer, and wherein an effective work function of the first gate stack is different from an effective work function of the second gate stack.

20 Claims, 16 Drawing Sheets

(51) Int. Cl.
    H01L 29/49     (2006.01)
    H01L 29/51     (2006.01)

(56) References Cited

U.S. PATENT DOCUMENTS

| | | | |
|---|---|---|---|
| 9,041,082 B2 | 5/2015 | Dubourdieu et al. | |
| 9,484,924 B2 | 11/2016 | Shin et al. | |
| 9,536,992 B2 | 1/2017 | Van Bentum et al. | |
| 9,608,110 B2 | 3/2017 | Baars et al. | |
| 10,134,633 B1* | 11/2018 | Kamineni | H01L 29/785 |
| 2012/0256275 A1 | 10/2012 | Huang et al. | |
| 2015/0126023 A1* | 5/2015 | Choi | H01L 29/512 438/591 |
| 2016/0035856 A1 | 2/2016 | Van Bentum et al. | |
| 2016/0351569 A1* | 12/2016 | Song | H01L 27/092 |
| 2017/0053996 A1* | 2/2017 | Kim | H01L 21/823842 |
| 2017/0062282 A1* | 3/2017 | Lin | H01L 27/092 |
| 2017/0110554 A1* | 4/2017 | Tak | H01L 29/66439 |
| 2017/0213826 A1* | 7/2017 | Kim | H01L 29/4966 |
| 2017/0338350 A1 | 11/2017 | Flachowsky et al. | |
| 2017/0358684 A1 | 12/2017 | Chen et al. | |
| 2017/0365719 A1 | 12/2017 | Chen et al. | |
| 2018/0096894 A1 | 4/2018 | Smith et al. | |
| 2018/0226417 A1 | 8/2018 | Ando et al. | |
| 2019/0326284 A1 | 10/2019 | Kim et al. | |
| 2020/0013897 A1 | 1/2020 | Park et al. | |
| 2020/0135577 A1* | 4/2020 | Yeh | H01L 21/324 |

FOREIGN PATENT DOCUMENTS

| | | |
|---|---|---|
| KR | 10-2006-0120952 | 11/2006 |
| KR | 10-2008-0079940 | 9/2008 |
| KR | 10-2015-0037009 | 4/2015 |
| KR | 10-2017-0105742 | 9/2017 |

OTHER PUBLICATIONS

Korean Office Action issued in corresponding Korean Patent Appln No. 10-2019-0001698 dated Jan. 20, 2023.
Notice of Allowance issued in corresponding Korean Patent Application No. 10-2019-0001698 dated Jul. 14, 2023.

* cited by examiner

SEMICONDUCTOR DEVICE

CROSS-REFERENCE TO RELATED APPLICATIONS

This application is a continuation of U.S. patent application Ser. No. 16/451,787 filed on Jun. 25, 2019, which claims priority under 35 U.S.C. § 119 to Korean Patent Application No. 10-2018-0078126, filed on Jul. 5, 2018, and Korean Patent Application No. 10-2019-0001698, filed on Jan. 7, 2019 in the Korean Intellectual Property Office, the disclosures of which are incorporated by reference herein in their entireties.

1. TECHNICAL FIELD

The present inventive concept relates to a semiconductor device, and more particularly, to a semiconductor device including a transistor having negative capacitance (NC) using a ferroelectric material.

2. DESCRIPTION OF THE RELATED ART

The development of metal-oxide semiconductor field-effect transistors (MOSETs) has enabled the integration density of integrated circuits to be continuously increased. For example, the integration density of integrated circuits, which is typically defined as a total number of transistors per unit chip area, has doubled every two years. To increase the integration density of integrated circuits, the size of individual transistors has been continuously reduced. Accordingly, semiconductor technologies for improving the performance of miniaturized transistors have been introduced.

These semiconductor technologies may include a high dielectric constant (high-k) metal gate (HKMG) technology and a fin field-effect transistor (FinFET) technology. The HKMG technology improves gate capacitance and reduces leakage current, and the FinFET technology improves a short channel effect (SCE) in which the electric potential of a channel region is affected by a drain voltage.

However, a reduction in the driving voltage of transistors has not correlated with a reduction in the transistor size. Accordingly, the power density of complementary metal-oxide-semiconductor (CMOS) transistors is increasing exponentially. To reduce the power density, the driving voltage should be reduced. However, since silicon-based MOSFETs have thermal emission-based physical operating characteristics, very law supply voltages are not common.

Accordingly, there is a need for a transistor having a subthreshold swing (SS) of less than 60 mV/decade, which is a physical limit of the SS, at room temperature.

SUMMARY

According to an exemplary embodiment of the present inventive concept, there is provided a semiconductor device, comprising a first transistor which comprises a first gate stack on a substrate; and a second transistor which comprises a second gate stack on the substrate, wherein the first gate stack comprises a first ferroelectric material layer disposed on the substrate, a first work function layer disposed on the first ferroelectric material layer and a first upper gate electrode disposed on the first work function layer, wherein the second gate stack comprises a second ferroelectric material layer disposed on the substrate, a second work function layer disposed on the second ferroelectric material layer and a second upper gate electrode disposed on the second work function layer, wherein the first work function layer comprises the same material as the second work function layer, and wherein an effective work function of the first gate stack is different from an effective work function of the second gate stack.

According to an exemplary embodiment of the present inventive concept, there is provided a semiconductor device, comprising a first transistor which comprises a first gate stack on a substrate; and a second transistor which comprises a second gate stack on the substrate, wherein the first gate stack comprises a first ferroelectric material layer disposed on the substrate, a first work function layer contacting the first ferroelectric material layer and a first upper gate electrode disposed on the first work function layer, wherein the second gate stack comprises a second ferroelectric material layer disposed on the substrate, a second work function layer contacting the second ferroelectric material layer and a second upper gate electrode disposed on the second work function layer, wherein the first ferroelectric material layer and the second ferroelectric material layer comprise the same material, wherein a thickness of the first ferroelectric material layer is equal to a thickness of the second ferroelectric material layer, and wherein an effective work function of the first gate stack is different from an effective work function of the second gate stack.

According to an exemplary embodiment of the present inventive concept, there is provided a semiconductor device, comprising a first negative capacitance field-effect transistor (NCFET) which comprises a first gate stack on a substrate; and a second NCFET which comprises a second gate stack on the substrate, wherein the first gate stack comprises a first interfacial layer disposed on the substrate, a first gate insulating layer disposed on the first interfacial layer, a first work function layer disposed on the first gate insulating layer and a first upper gate electrode disposed on the first work function layer, wherein the second gate stack comprises a second interfacial layer disposed on the substrate, a second gate insulating layer disposed on the second interfacial layer, a second work function layer disposed on the second gate insulating layer and a second upper gate electrode disposed on the second work function layer, and wherein a structure of the first gate stack is different from a structure of the second gate stack, and wherein an effective work function of the first gate stack is different from an effective work function of the second gate stack.

BRIEF DESCRIPTION OF THE DRAWINGS

The above and other features of the present inventive concept will become more apparent by describing in detail exemplary embodiments thereof, with reference to the accompanying drawings in which.

DETAILED DESCRIPTION OF THE EMBODIMENTS

Figure 1:
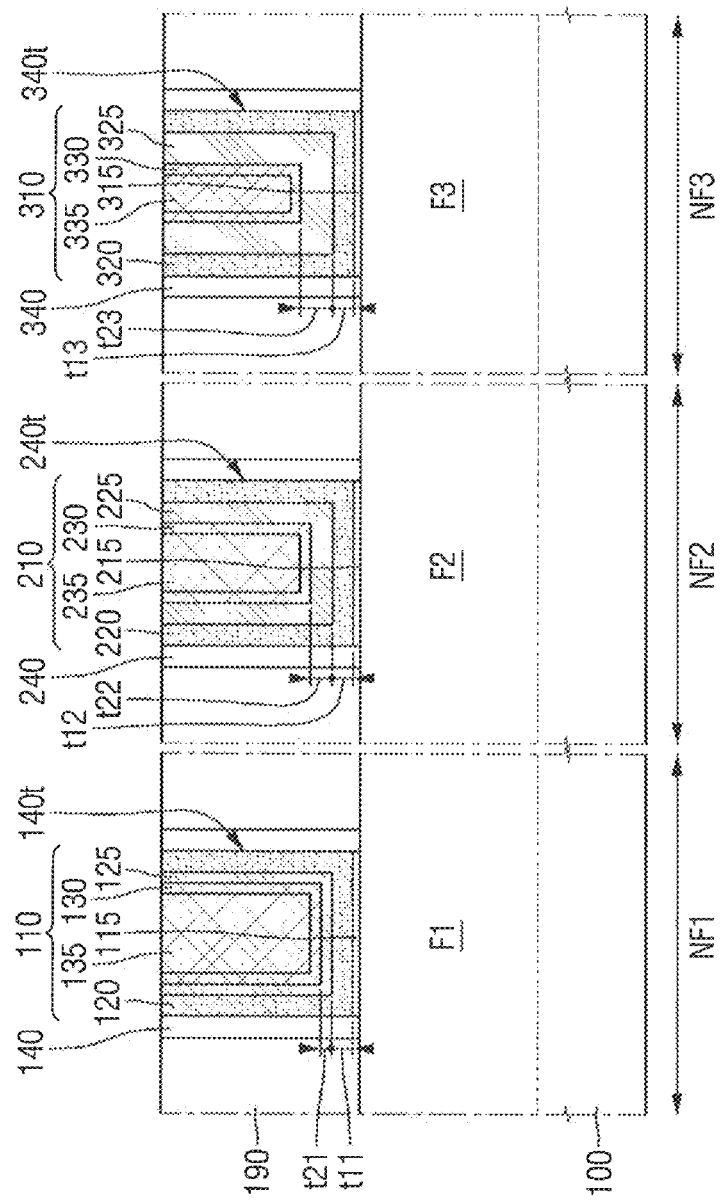
FIG. 1 is a cross-sectional view of a semiconductor device according to exemplary embodiments of the present inventive concept.

In the drawings accompanying this disclosure, a fin field-effect transistor (FinFET) including a fin pattern-shaped channel region is illustrated by way of example. However, the present inventive concept is not limited to the FinFET. The exemplary embodiments of the present inventive concept disclosed herein are applicable to a transistor including a nanowire, a transistor including a nanosheet or a three-dimensional (3D) transistor, in addition, the exemplary embodiments of the present inventive concept disclosed herein are applicable to a planar transistor. It is to be understood that in the drawings, like reference numerals may refer to like elements.

Figure 2:
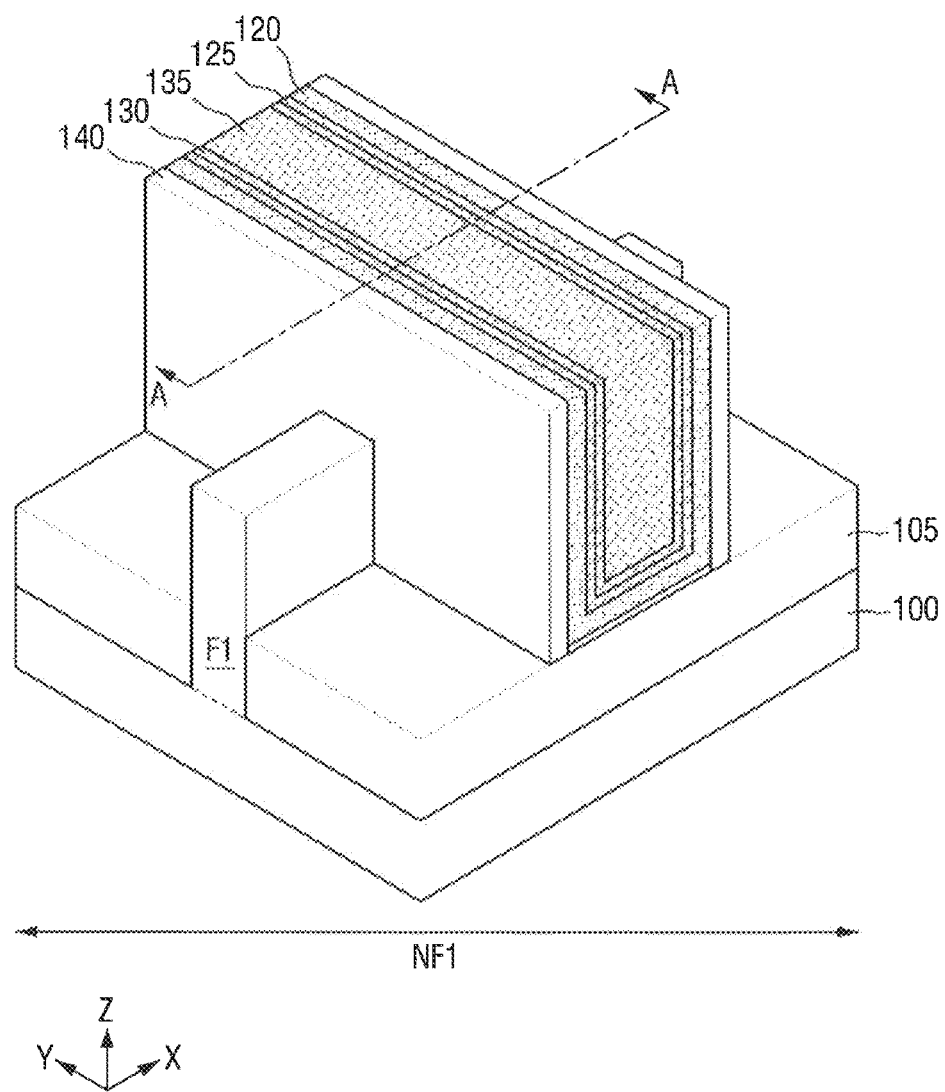
FIG. 2 is a perspective view of a first fin transistor illustrated in FIG. 1.
Figure 3:
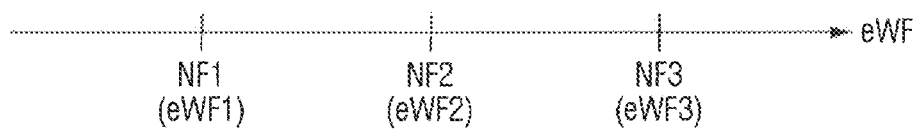
FIG. 3 is a diagram for explaining an effect of the semiconductor device of FIG. 1.

FIG. 1 is a cross-sectional view of a semiconductor device according to exemplary embodiments of the present inventive concept. FIG. 2 is a perspective view of a first fin transistor NF1 illustrated in FIG. 1. FIG. 3 is a for explaining an effect of the semiconductor device of FIG. 1.

For reference, although source/drain regions of first, second and third fin transistors NF1, NF2 and NF3 are not illustrated in FIGS. 1 and 2, this is merely for ease of description, and the present inventive concept is not limited thereto. In addition, the cross section of the first fin transistor NF1 of FIG. 1 may be a cross section taken along A-A of FIG. 2.

Referring to FIG. 1, the semiconductor device according to the exemplary embodiments of the present inventive concept may include the first fin transistor NF1, the second fin transistor NF2 and the third fin transistor NF3 formed on a substrate 100.

Each of the first through third fin transistors NF1 through NF3 may be a FinFET using a three-dimensional (3D) channel. For example, the first through third fin transistors NF1 through NF3 may be transistors of the same conductivity type (e.g., an N type or P type). For another example, at least one of the first through third fin transistors NF1 through NF3 may be a P-type transistor, and the other may be an N-type transistor.

Each of the first through third fin transistors NF1 through NF3 may be a negative capacitance (NC) FET using a negative capacitor. Here, the negative capacitor is a capacitor having negative capacitance and may be connected in series to a positive capacitor to increase its capacitance.

The first through third fin transistors NF1 through NF3 which are NCFETs may include an insulating layer having ferroelectric characteristics. Each of the first through third fin transistors NF1 through NF3 may have a subthreshold swing (SS) of less than 60 mV/decade at room temperature.

Although the first through third fin transistors NF1 through NF3 are illustrated as being formed on the substrate 100, this is merely for ease of description, and the present inventive concept is not limited thereto. For example, at least two of the first through third fin transistors NF1 through NF3 may be formed on the substrate 100.

Referring first to the first fin transistor NF1 illustrated in FIGS. 1 and 2, the first fin transistor NF1 may include a first fin pattern F1, a first gate stack 110, and first gate spacers 140. The first gate stack 110 may include a first interfacial layer 115, a first ferroelectric material layer 120, a first work function layer 125, a first interposing conductive layer 130, and a first filling layer 135.

The substrate 100 may be a bulk silicon substrate or a silicon-on-insulator (SOI) substrate. Additionally, the substrate 100 may be, but is not limited to, a silicon substrate or a substrate made of another material such as silicon germanium, silicon germanium-on-insulator (SGOI), indium antimonide, lead telluride, indium arsenide, indium phosphide, gallium arsenide or gallium antimonide.

The first fin pattern F1 may protrude from the substrate 100. The first fin pattern F1 may extend along a first direction X on the substrate 100.

The first fin pattern F1 may be a part of the substrate 100 or may include an epitaxial layer grown from the substrate 100. The first fin pattern F1 may include an elemental semiconductor material such as silicon or germanium. In addition, the first fin pattern F1 may include a compound semiconductor such as a group IV-IV compound semiconductor or a group III-V compound semiconductor.

The group IV-IV compound semiconductor may be, e.g., a binary or ternary compound including two or more of carbon (C), silicon (Si), germanium (Ge) and tin (Sn) or a compound obtained by doping the binary or ternary compound with a group IV element. The group III-V compound semiconductor may be, e.g., a binary, ternary, or quaternary compound composed of aluminum (Al), gallium (Ga) or indium (In) (e.g., group III elements) bonded with phosphorus (P), arsenic (As) or antimony (Sb) (e.g., group V elements).

A field insulating layer 105 may be formed on the substrate 100. The field insulating layer 105 may be formed on part of sidewalls of the first fin pattern F1.

A top surface of the first fin pattern F1 may protrude above a top surface of the field insulating layer 105. The field insulating layer 105 may include, e.g., a silicon oxide layer, a silicon nitride layer, or a silicon oxynitride layer.

An interlayer insulating film 190 may be disposed on the field insulating layer 105. A first gate trench 140*t* may be formed in the interlayer insulating film 190. The first gate trench 140*t* may be defined by the first gate spacers 140.

The first gate spacers 140 may include, e.g., silicon nitride (SiN), silicon oxynitride (SiON), silicon oxide (SiO$_2$), or silicon oxycarbonitride (SiOCN).

The interlayer insulating film 190 may include, but is not limited to, silicon oxide, silicon nitride, silicon oxynitride, flowable oxide (FOX), toner silazen (TOSZ), undoped silicate glass (USG), borosilicate glass (BSG), phosphosilicate glass (PSG), borophosphosilicate glass (BPSG), plasma enhanced tetraethylorthosilicate (PETEOS), fluoride silicate glass (FSG), carbon doped silicon oxide (CDO)), xerogel, aerogel, amorphous fluorinated carbon, organo silicate glass (OSG), parylene, bis-benzocyclobutenes (BCB), polyimide, a porous polymeric material, or a combination of the same.

The first gate stack 110 may be formed in the first gate trench 140. The first gate stack 110 entirely fills the first gate trench 140t. Although a top surface of the first gate stack 110 lies in the same plane with a top surface of the interlayer insulating film 190 in the drawings, the present inventive concept is not limited thereto.

A capping pattern may also be formed on the first gate slack 110 to partially fill the first gate trench 140t. In this ease, a top surface of the capping pattern may lie in the same plane with the top surface of the interlayer insulating film 190.

The first interfacial layer 115 may be formed on the substrate 100. The first interfacial layer 115 may be formed on the first fin pattern F1. For example, the first interfacial layer 115 may directly contact the first fin pattern F1.

The first interfacial layer 115 may be formed in the first gate trench 140t. Although the first interfacial layer 115 is illustrated as being formed on a bottom surface of the first gate trench 140t, the present inventive concept is not limited thereto. The first interfacial layer 115 may also be formed on sidewalls of the first gate trench 140t depending on a manufacturing method.

When the first tin pattern F1 includes silicon, the first interfacial layer 115 may include a silicon oxide layer. The first interfacial layer 115 may be formed using, but not limited to, a chemical oxidation method, an ultraviolet (UV) oxidation method, or a dual plasma oxidation method.

The first ferroelectric material layer 120 may be formed on the first interfacial layer 115. The first interfacial layer 115 may be disposed between the first ferroelectric material layer 120 and the first fin pattern F1. The first ferroelectric material layer 120 may be formed along inner walls of the first gate trench 140t. For example, the first ferroelectric material layer 120 may be formed along the sidewalk and bottom surface of the first gate trench 140t.

The first ferroelectric material layer 120 may be formed using, but not limited to, chemical vapor deposition (CVD) or atomic layer deposition (ALD).

The first ferroelectric material layer 120 may have ferroelectric characteristics. The first ferroelectric material layer 120 may have a thickness sufficient to have the ferroelectric characteristics. For example, the thickness of the first ferroelectric material layer 120 may be, but is not limited to, 3 to 10 nm. Since a critical thickness exhibiting the ferroelectric characteristics may be different for each ferroelectric material, the thickness of the first ferroelectric material layer 120 may vary according to the ferroelectric material.

The first ferroelectric material layer 120 may include, e.g., hafnium oxide, hafnium zirconium oxide, zirconium oxide, barium strontium titanium oxide, barium titanium oxide, or lead zirconium titanium oxide. Here, hafnium zirconium oxide may be a material obtained by doping hafnium oxide with zirconium (Zr) or may be a compound of hafnium (Hf), zirconium (Zr) and oxygen (O).

The first ferroelectric material layer 120 may further include a doping element doped in the above-described materials. The doping element may be aluminum (Al), titanium (Ti), niobium (Nb), lanthanum (La), yttrium (Y), magnesium (Mg), silicon (Si), calcium (Ca), cerium (Ce), dysprosium (Dv), erbium (Er), gadolinium (Gd), germanium (Ge), scandium (Sc), strontium (Sr), or tin (Sn).

The first interfacial layer 115 and the first ferroelectric material layer 120 may be gate insulating layers of the first fin transistor NF1. The first interfacial layer 115 may be a lower gate insulating layer having a positive capacitance, and the first ferroelectric material layer 120 may be an upper gate insulating layer having a negative capacitance.

A conductive layer may also be formed between the first interfacial layer 115 and the first ferroelectric material layer 120. Alternatively, a high dielectric constant (high-k) insulating layer and a conductive layer stacked sequentially may be formed between the first interfacial layer 115 and the first ferroelectric material layer 120. In this case, the high dielectric constant (high-k) insulating layer may be directly disposed on the first interfacial layer 115.

The first work function layer 125 may be formed on the first ferroelectric material layer 120. The first work function layer 125 may be formed along the sidewalls and bottom surface of the first gate trench 140t. The first work function layer 125 may contact the first ferroelectric material layer 120.

The first work function layer 125 may include, e.g., titanium nitride (TiN), titanium carbonitride (TiCN), or tungsten carbonitride (WCN).

The first interposing conductive layer 130 may be formed on the first work function layer 125. The first interposing conductive layer 130 may be formed along the sidewalls and bottom surface of the first gate trench 140t.

The first interposing conductive layer 130 may include, e.g., titanium aluminum (TiAl), titanium aluminum carbide (TiAlC), tantalum aluminum carbide (TaAlC), vanadium aluminum carbide (VAlC), titanium aluminum silicon carbide (TiAlSiC), or tantalum aluminum silicon carbide (TaAlSiC).

The first filling layer 135 may be formed on the first interposing conductive layer 130. The first filling layer 135 may fill the first gate trench 140t. The first filling layer 135 may include tungsten (W), aluminum (Al), copper (Cu), cobalt (Co), titanium (Ti), or titanium nitride (TiN).

The first interposing conductive layer 130 and the first filling layer 135 may be a first upper gate electrode formed on the first work function layer 125.

The second fin transistor NF2 may include a second fin pattern F2, a second gate stack 210, and second gate spacers 240. The second gate stack 210 is formed in a second gate trench 240t.

The second gate stack 210 may include a second interfacial layer 215, a second ferroelectric material layer 220, a second work function layer 225, a second interposing conductive layer 230, and a second filling layer 235. The second work function layer 225 may be disposed on the second ferroelectric material layer 220 to contact the second ferroelectric material layer 220. For example, the second work function layer 225 may directly contact the second ferroelectric material layer 220.

The third fin transistor NF3 may include a third fin pattern F3, a third gate stack 310, and third gate spacers 340. The third gate stack 310 is formed in a third gate trench 340t.

The third gate stack 310 may include a third interfacial layer 315, a third ferroelectric material layer 320, a third work function layer 325, a third interposing conductive layer 330, and a third filling layer 335. The third work function layer 325 may be disposed on the third ferroelectric material layer 320 to contact the third ferroelectric material layer 320. For example, the third work function layer 325 may directly contact the third ferroelectric material layer 320.

The first through third fin patterns F1 through F3 may be, but are not necessarily, made of the same material and have the same thickness. The first through third interfacial layers 115 through 315 may be, but are not necessarily, made of the same material. The first through third interposing conductive layers 130 through 330 may be, but are not necessarily, made of the same material, and the first through third filling layers 135 through 335 may be, but are not necessarily, made of the same material.

The first through third ferroelectric material layers 120 through 320 may include the same material. The first through third work function layers 125 through 325 may be made of the same material.

A thickness a t11 of the first ferroelectric material layer 120 may be equal to a thickness t12 of the second ferroelectric material layer 220 and a thickness t13 of the third ferroelectric material layer 320.

A thickness t22 of the second work function layer 225 is greater than a thickness t21 of the first work function layer 125 and smaller than a thickness t23 of the third work function layer 325. In this case, the upper gate electrodes of the first, second and third gate structures 110, 210 and 310 may have different sizes.

In the semiconductor device according to the exemplary embodiments of the present inventive concept, an effective work function eWF1 of the first gate stack 110, an effective work function eWF2 of the second gate stack 210, and an effective work function eWF3 of the third gate stack 310 may be different from each other.

Since the first through third gate stacks 110 through 310 have different structures due, for example, to the differing thicknesses of the first to third work function layers 125 to 325, the effective work functions eWF1 through eWF3 of the first through third agate stacks 110 through 310 may be different from each other.

Here, when gate stacks have different structures, it may mean that materials included (e.g., doped) in ferroelectric material layers of the gate stacks are different from each other or that materials included in work function layers of the gate stacks are different from each other. In addition, when the gate stacks have different structures, it may mean that thicknesses of the work function layers are different from each other. In other words, if the types and presence or absence of the materials doped in the ferroelectric material layers, the materials included in the work function layers, or the thicknesses of the work function layers are different from each other, it can be said that the gate stacks have different structures.

In the semiconductor device according to the exemplary embodiments of the present inventive concept, the effective work functions eWF1 through eWF3 of the first through third gate stacks 110 through 310 can be adjusted by adjusting the thickness t21 of the first work function layer 125, the thickness t22 of the second work function layer 225 and the thickness 123 of the third work function layer 325. For example, if the thickness t21 of the first work function layer 125 and the thickness t22 of the second work function layer 225 are the same, the effective work functions eWF1 and eWF2 of the first and second gate stacks 110 and 210 might be the same.

When the first through third fin transistors NF1 through NF3 are of the same conductivity type, they may have different threshold voltages.

In FIGS. 1 through 3, the first through third work function layers 125 through 325 may include, for example, a titanium nitride (TiN) layer.

As the thickness of the TiN layer increases, the effective work function of a gate stack may increase. In other words, the effective work function eWF2 of the second gate stack 210 is greater than the effective work function eWF1 of the first gate stack 110 and smaller than the effective work function eWF3 of the third gate stack 310.

Figure 4:
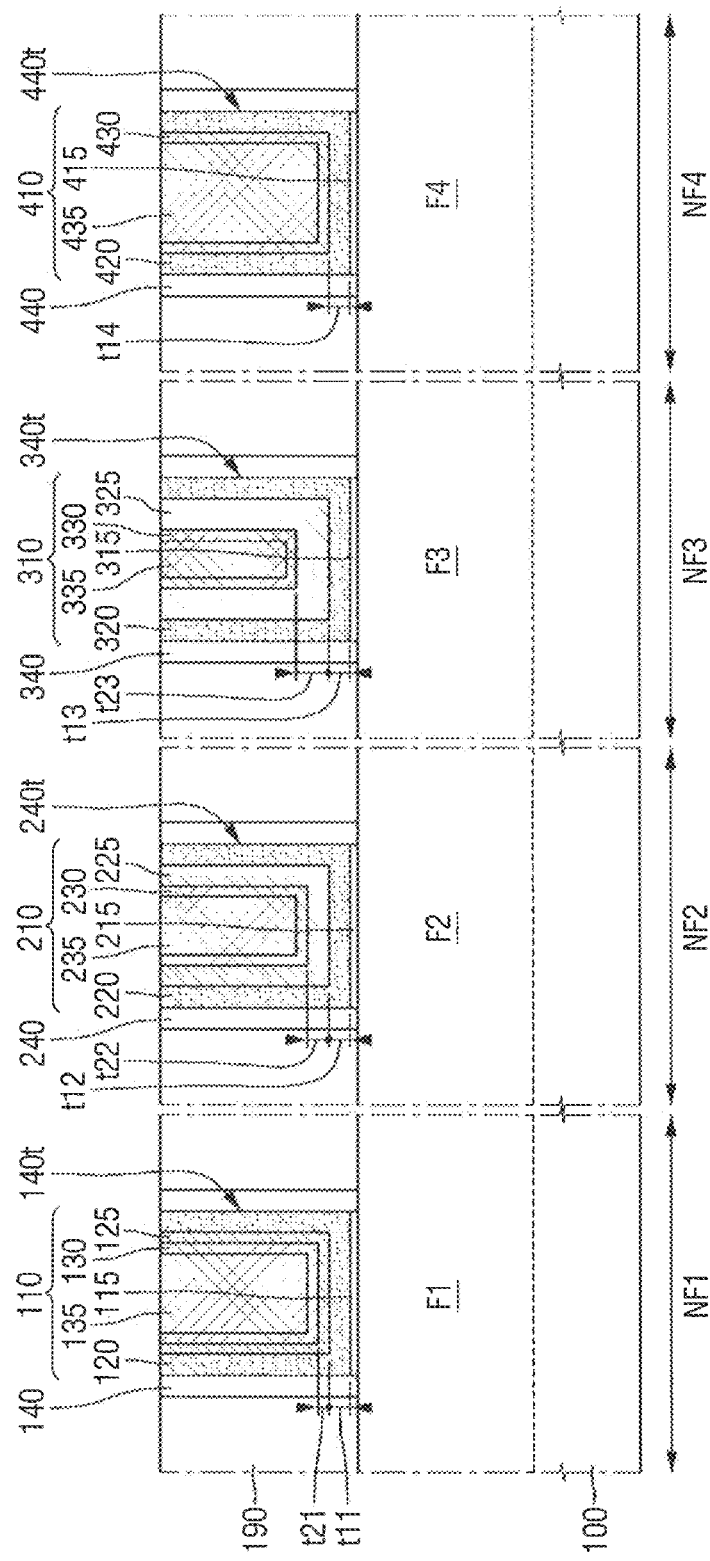
FIG. 4 is a cross-sectional view of a semiconductor device according to exemplary embodiments of the present inventive concept.

FIG. 4 is a cross-sectional view of a semiconductor device according to exemplary embodiments of the present inventive concept. For the sake of convenience, differences from FIGS. 1 through 3 will be mainly described below.

Referring to FIG. 4, the semiconductor device according to the exemplary embodiments of the present inventive concept may include a first fin transistor NF1, a second fin transistor NF2, a third fin transistor NF3 and a fourth fin transistor NF4 formed on a substrate 100.

For example, the fourth fin transistor NF4 may be an NCFET.

The fourth fin transistor NF4 may include a fourth fin pattern F4, a fourth gate stack 410, and fourth gate spacers 440. The fourth gate stack 410 is formed in a fourth gate trench 440t.

The fourth gate stack 410 may include a fourth interfacial layer 415, a fourth ferroelectric material layer 420, a fourth interposing conductive layer 430, and a fourth filling layer 435. The fourth gate stack 410 may not include a work function layer like the first through third gate stacks 110 through 310.

The fourth ferroelectric material layer 420 may include the same material as a first ferroelectric material layer 120. A thickness t14 of the fourth ferroelectric material layer 420 may be equal to a thickness t11 of the first ferroelectric material layer 120.

Since the fourth gate stack 410 does not include a work function layer, an effective work function of the fourth gate stack 410 may be smaller than that of the first gate stack 110.

Figure 5:
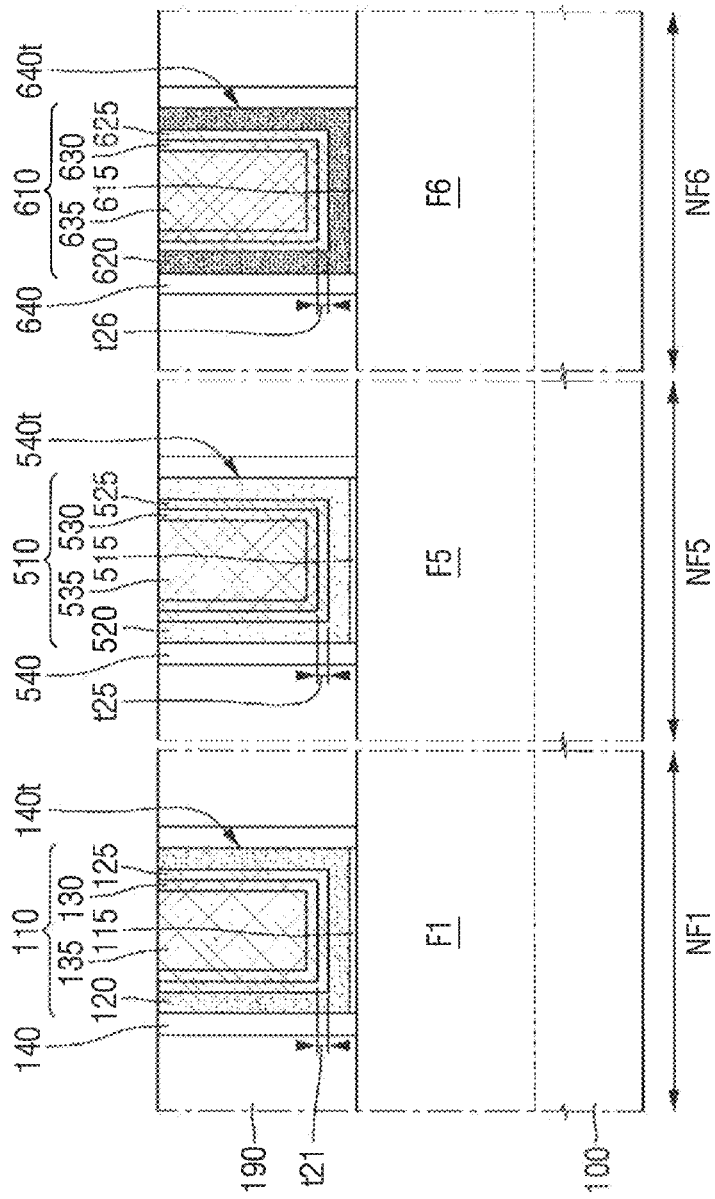
FIGS. 5 and 6 are diagrams for explaining a semiconductor device according to exemplary embodiments of the present inventive concept.
Figure 6:
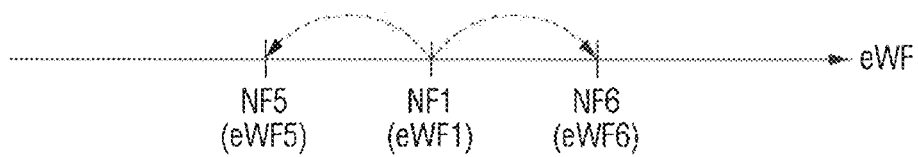

FIGS. 5 and 6 are diagrams for explaining a semiconductor device according to exemplary embodiments of the present inventive concept. For the sake of convenience, differences from FIGS. 1 through 3 will be mainly described below.

For reference, FIG. 5 is a cross-sectional view of a semiconductor device according to exemplary embodiments of the present inventive concept, and FIG. 6 is a diagram for explaining an effect of the semiconductor device of FIG. 5.

Referring to FIG. 5, the semiconductor device according to the exemplary embodiments of the present inventive concept may include a first fin transistor NF1, a fifth fin transistor NF5 and a sixth fin transistor NF6 formed on a substrate 100.

The first fin transistor NF1, the fifth fin transistor NF5 and the sixth fin transistor NF6 may be, but are not necessarily, of the same conductivity type. Each of the fifth fin transistor NF5 and the sixth fin transistor NF6 may be an NCFET.

Although the first fin transistor NF1, the fifth fin transistor NF5 and the sixth fin transistor NF6 are illustrated as being formed on the substrate 100, this is merely for ease of description, and the present inventive concept is not limited thereto. For example, at least two of the first fin transistor NF1, the fifth fin transistor NE5 and the sixth fin transistor NF6 may be formed on the substrate 100.

The fifth fin transistor NF5 may include a fifth fin pattern F5, a fifth gate stack 510, and fifth gate spacers 540. The fifth gate stack 510 is formed in a fifth gate trench 540t.

The fifth gate stack 510 may include a fifth interfacial layer 515, a fifth ferroelectric material layer 520, a fifth work function layer 525, a fifth interposing conductive layer 530, and a fifth filling layer 535. The fifth work function layer 525 may be disposed on the fifth ferroelectric material layer 520 to contact the fifth ferroelectric material layer 520.

The sixth fin transistor NF6 may include a sixth fin pattern F6, a sixth gate stack 610, and sixth gate spacers 640. The sixth gate stack 610 is formed in a sixth gate trench 640t.

The sixth gate stack 610 may include a sixth interfacial layer 615, a sixth ferroelectric material layer 620, a sixth work function layer 625, a sixth interposing conductive layer 630, and a sixth filling layer 635. The sixth work function layer 625 may be disposed on the sixth ferroelectric material layer 620 to contact the sixth ferroelectric material layer 620.

The first fin pattern F1, the fifth fin pattern F5 and the sixth fin pattern F6 may be, but are not necessarily, made of the same material to have the same thickness. A first interfacial layer 115, the fifth interfacial layer 515 and the sixth interfacial layer 615 may be, but are not necessarily, made of the same material. A first interposing conductive layer 130, the fifth interposing conductive layer 530 and the sixth interposing conductive layer 630 may be, but are not necessarily, made of the same material, and a first filling layer 135, the fifth filling layer 535 and the sixth filling layer 635 may be, but are not necessarily, made of the same material.

A first work function layer 125, the fifth work function layer 525 and the sixth work function layer 625 may include the same material. In addition, a thickness t21 of the first work function layer 125 may be equal to a thickness t25 of the fifth work function layer 525 and a thickness t26 of the sixth work function layer 625.

A first ferroelectric material layer 120, the fifth ferroelectric material layer 520 and the sixth ferroelectric material layer 620 may include the same metal oxide. For example, the first ferroelectric material layer 120, the fifth ferroelectric material layer 520 and the sixth ferroelectric material layer 620 may include hafnium (Hf). The first ferroelectric material layer 120, the fifth ferroelectric material layer 520 and the sixth ferroelectric material layer 620 may include hafnium oxide.

Alternatively, the fifth ferroelectric material layer 520 may include a doped first work function material, and the sixth ferroelectric material layer 620 may include a doped second work function material. However, the first ferroelectric material layer 120 may not include the first work function material and the second work function material.

The first work function material may be a control material that reduces an effective work function. The first work function material may include, for example, lanthanum (La), magnesium (Mg), or yttrium (Y). The fifth ferroelectric material layer 520 may include doped nitrogen (N) in addition to the first work function material.

The second work function material may be a control material that increases an effective work function. The second work function material may include, for example, aluminum (Al), titanium (Ti), or niobium (Nb). The sixth ferroelectric material layer 620 may include doped nitrogen (N) in addition to the second work function material.

A work function material may form a dipole within a ferroelectric material layer, thereby changing the effective work function of a gate stack including the ferroelectric material layer.

After a work function material supply layer is formed on a ferroelectric material layer, it may be treated with heat to diffuse a work function material into the ferroelectric material layer. The thickness of a ferroelectric material layer including a work function material may be equal to or greater than the thickness of a ferroelectric material layer not including the work function material.

Since the first ferroelectric material layer 120 does not include the first and second work function materials, the structure of a first gate stack 110 may be different from the structure of the fifth gate stack 510 and the structure of the sixth gate stack 610. In addition, since the fifth ferroelectric material layer 520 includes the first work function material and the sixth ferroelectric material layer 620 includes the second work function material, the structure of the fifth gate stack 510 may be different from that of the sixth gate stack 610.

In the semiconductor device according to the exemplary embodiments of the present inventive concept, since the structure of the first gate stack 110, the structure of the fifth gate stack 510 and the structure of the sixth gate stack 610 are different from each other, an effective work function eWF1 of the first gate stack 110, an effective work function eWF5 of the fifth gate stack 510, and an effective work function eWF6 of the sixth gate stack 610 may be different from each other. For example, the of work function eWF1 of the first gate stack 110 may be less than the effective work function eWF6 of the sixth gate stack 610 and greater than the effective work function eWF5 of the fifth gate stack 510.

In the semiconductor device according to the exemplary embodiments of the present inventive concept, each of the effective work function eWF1 of the first gate stack 110, the effective work function eWF5 of the fifth gate stack 510 and the effective work function eWF6 of the sixth gate stack 610 may be adjusted according, to the presence or absence of a work function material doped in the ferroelectric material layer and the type of the work function material doped in the ferroelectric material layer.

When the first fin transistor NF1, the fifth fin transistor NF5 and the sixth fin transistor NF6 are of the same conductivity type, they may have different threshold voltages.

In FIG. 6, since the fifth ferroelectric material layer 520 includes the first work function material that reduces an effective work function and the sixth ferroelectric material layer 620 includes the second work function material that increases the effective work function, the effective work function eWF1 of the first gate stack 110 is greater than the effective work function eWF5 of the fifth gate stack 510 and smaller than the effective work function eWF6 of the sixth gate stack 610.

Figure 7:
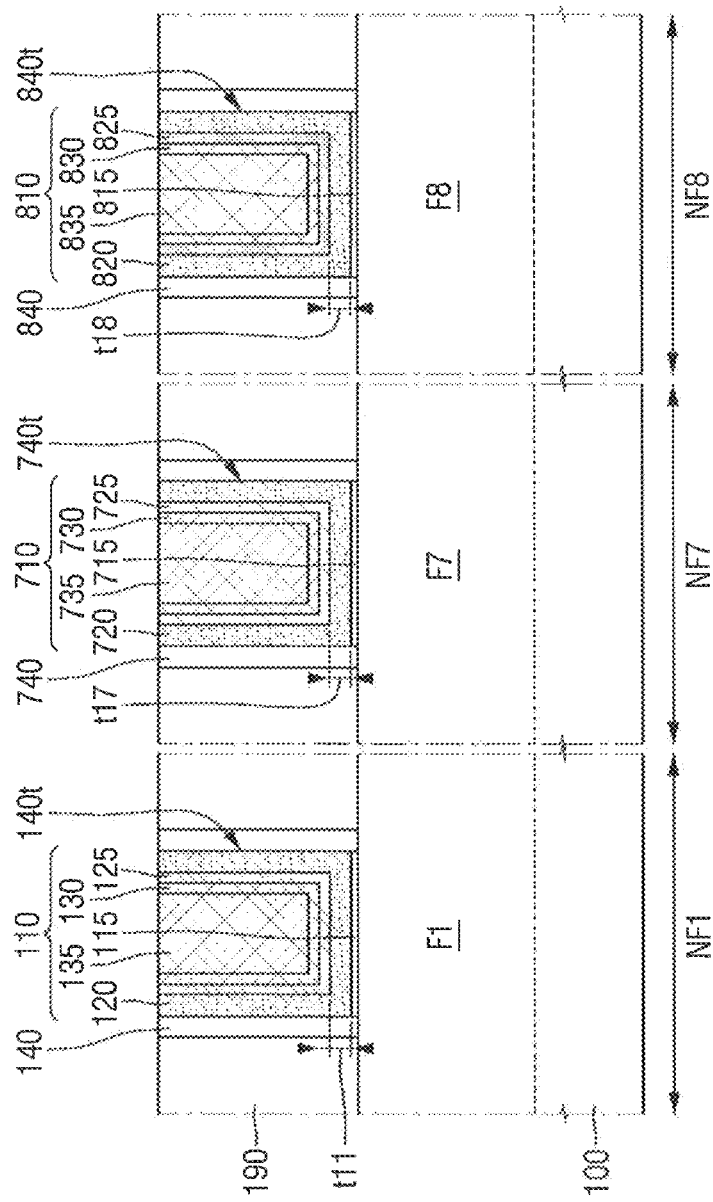
FIGS. 7 and 8 are diagrams for explaining a semiconductor device according to exemplary embodiments of the present inventive concept.
Figure 8:
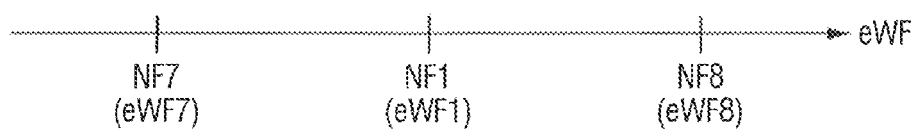

FIGS. 7 and 8 are diagrams for explaining a semiconductor device according to exemplary embodiments of the present inventive concept. For the sake of convenience, differences from FIGS. 1 through 3 will be mainly described below.

For reference, FIG. 7 is a cross-sectional view of a semiconductor device according to exemplary embodiments of the present inventive concept, and FIG. 8 is a diagram for explaining an effect of the semiconductor device of FIG. 7.

Referring to FIG. 7, the semiconductor device according to the exemplary embodiments of the present inventive concept may include a first fin transistor NF1, a seventh fin transistor NF7 and an eighth fin transistor NF8 formed on a substrate 100.

The first fin transistor NF1, the seventh fin transistor NF7 and the eighth fin transistor NF8 may be, but are not necessarily, of the same conductivity type. Each of the seventh fin transistor NF7 and the eighth fin transistor NF8 may be an NCFET.

Although the first fin transistor NF1, the seventh fin transistor NF7 and the eighth fin transistor NF8 are illustrated as being formed on the substrate 100, this is merely for ease of description, and the present inventive concept is not limited thereto. For example, at least two of the first fin transistor NF1, the seventh fin transistor NF7 and the eighth fin transistor NF8 may be formed on the substrate 100.

The seventh fin transistor NF7 may include a seventh fin pattern F7, a seventh gate stack 710, and seventh gate spacers 740. The seventh gate stack 710 is formed in a seventh gate trench 740t.

The seventh gate stack 710 may include a seventh interfacial layer 715, a seventh ferroelectric material layer 720, a seventh work function layer 725, a seventh interposing conductive layer 730, and a seventh filling layer 735. The seventh work function layer 725 may be disposed on the seventh ferroelectric material layer 720 to contact the seventh ferroelectric material layer 720.

The eighth fin transistor NF8 may include an eighth fin pattern F8, an eighth gate stack 810, and eighth gate spacers 840. The eighth gate stack 810 is formed in an eighth gate trench 840t.

The eighth gate stack 810 may include an eighth interfacial layer 815, an eighth ferroelectric material layer 820, an eighth work function layer 825, an eighth interposing conductive layer 830, and an eighth filling layer 835. The eighth work function layer 825 may be disposed on the eighth ferroelectric material layer 820 to contact the eighth ferroelectric material layer 820.

The first fin pattern F1, the seventh fin pattern F7 and the eighth fin pattern F8 may be, but are not necessarily, made of the same material and have the same thickness. A first interfacial layer 115, the seventh interfacial layer 715 and the eighth interfacial layer 815 may be, but are not necessarily, made of the same material. A first interposing, conductive layer 130, the seventh interposing conductive layer 730 and the eighth interposing conductive layer 830 may be, but are not necessarily, made of the same material, and a first filling layer 135, the seventh filling layer 735 and the eighth filling layer 835 may be, but are not necessarily, made of the same material.

A first ferroelectric material layer 120, the seventh ferroelectric material layer 720 and the eighth ferroelectric material layer 820 may include the same material. A thickness t11 of the first ferroelectric material layer 120 may be equal to a thickness t17 of the seventh ferroelectric material layer 720 and a thickness t18 of the eighth ferroelectric material layer 820.

A first work function layer 125, the seventh work function layer 725 and the eighth work function layer 825 may include different materials. The seventh work function layer 725 may include a material having a work function smaller than that of the first work function layer 125. The eighth work function layer 825 may include a material having a work function greater than that of the first work function layer 125.

The seventh work function layer 725 may include, for example, tungsten (W) titanium silicon nitride (TiSiN) titanium aluminum nitride (TiAlN), titanium boron nitride (TiBN), or tantalum nitride (TaN).

The eighth work function layer 82 may include, for example, platinum Pt), iridium (Ir), ruthenium (Ru), molybdenum nitride (MoN), or molybdenum (Mo).

Since the first work function layer 125, the seventh work function layer 725, and the eighth work function layer 825 include different materials, the structure of a first gate stack 110, the structure of the seventh gate stack 710, and the structure of the eighth gate stack 810 may be different from each other.

In the semiconductor device according, to the exemplary embodiments of the present inventive concept, since the structure of the first gate stack 110, the structure of the seventh gate stack 710 and the structure of the eighth gate stack 810 are different from each other, an effective work function eWF1 of the first gate stack 110, an effective work function eWF7 of the seventh gate stack 710, and an effective work function eWF8 of the eighth gate stack 810 may be different from each other. For example, the effective work function eWF1 of the first gate stack 110 may be less than the effective work function eWF8 of the eighth gate stack 810 and greater than the effective work function eWF7 of the seventh gate stack 710.

In the semiconductor device according to the exemplary embodiments of the present inventive concept, each of the effective work function eWF1 of the first gate stack 110, the effective work function eWF7 of the seventh gate stack 710 and the effective work function eWF8 of the eighth gate stack 810 may be adjusted according to the type of the work function layer.

When the first fin transistor NF1, the seventh fin transistor NF7 and the eighth fin transistor NF8 are of the same conductivity type, they may have different threshold voltages.

In FIG. 8, since the seventh work function layer 725 includes a material having a work function smaller than that of the first work function layer 125 and the eighth work function layer 825 includes a material having a work function higher than that of the first work function layer 125, the effective work function eWF1 of the first gate stack 110 is greater than the effective work function eWF7 of the seventh gate stack 710 and smaller than the effective work function eWF8 of the eighth gate stack 810.

By changing the thickness of the seventh work function layer 725 or the thickness of the eighth work function layer 825, it is possible to form a gate stack having various effective work functions.

Figure 9:
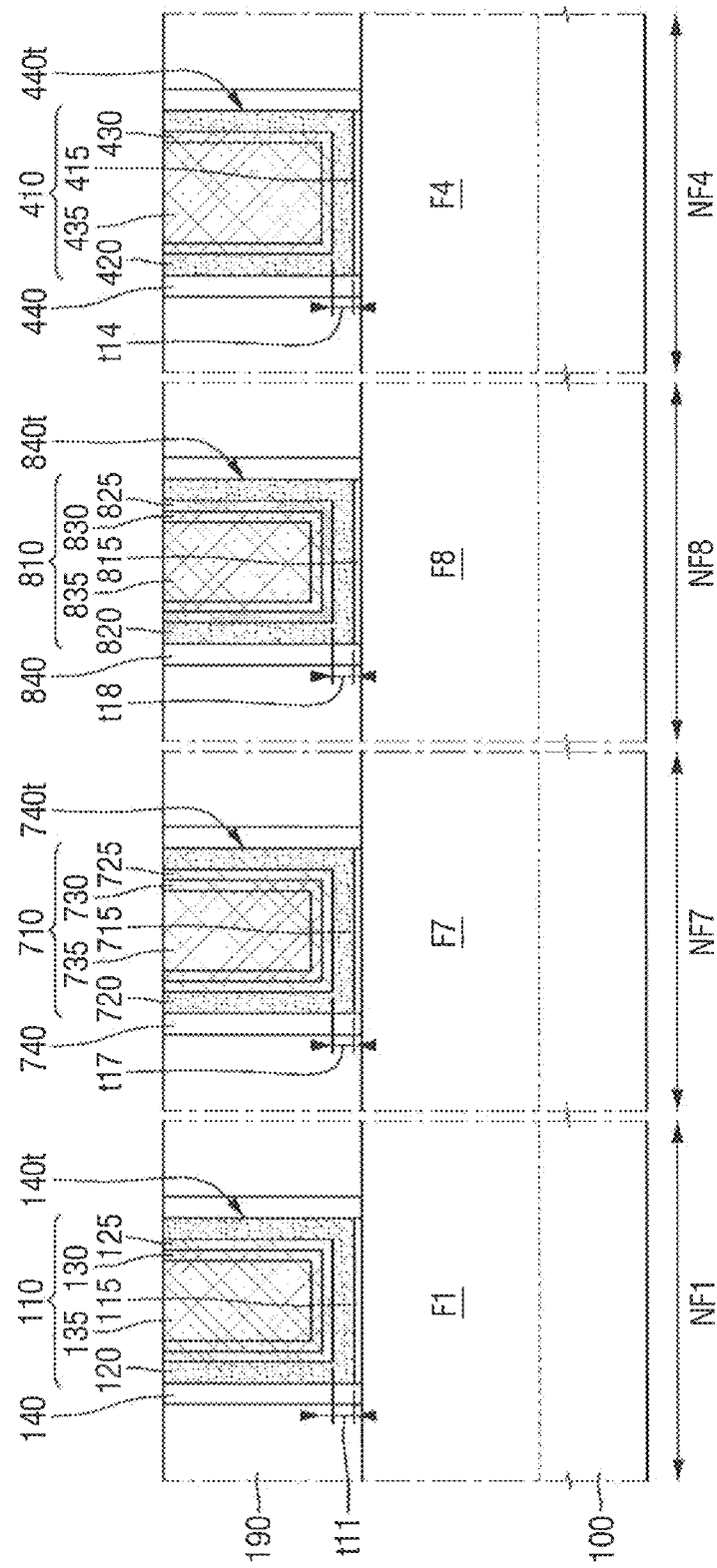
FIG. 9 is a cross-sectional view of a semiconductor device according to exemplary embodiments of the present inventive concept.

FIG. 9 is a cross-sectional view of a semiconductor device according to exemplary embodiments of the present inventive concept. For the sake of convenience, differences from FIGS. 1 through 3 will be mainly described below.

Referring to FIG. 9, the semiconductor device according to the exemplary embodiments of the present inventive concept may further include a fourth fin transistor NF4.

A fourth gate stack 410 may include a fourth interposing conductive layer 430. The fourth interposing conductive layer 430 may be a material having a work function smaller than that of a seventh work function layer 725.

Therefore, an effective work function of the fourth gate stack 410 may be smaller than that of a seventh gate stack 710.

Although the fourth gate stack 410 is illustrated as not including a work function layer, the present inventive concept is not limited thereto. The fourth gate stack 410 may also include a fourth work function layer containing a material whose work function is lower than that of the seventh work function layer 725. In this case, the fourth work function layer may include, e.g., titanium aluminum (TiAl), titanium aluminum carbide (TiAlC) tantalum aluminum carbide (TaAlC), vanadium aluminum carbide (VAlC) titanium aluminum silicon carbide (TiAlSiC), or tantalum aluminum silicon carbide (TaAlSiC).

Figure 10:
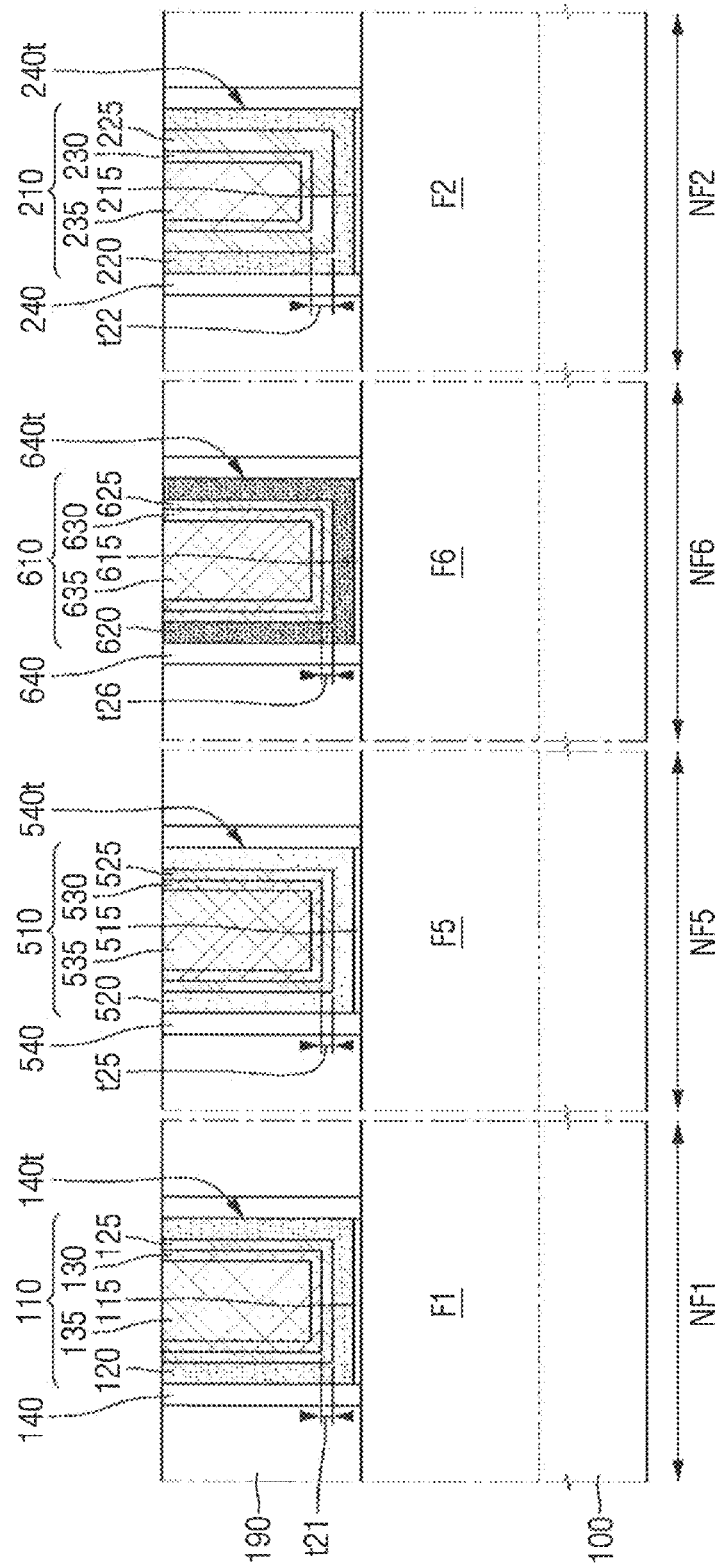
FIGS. 10 and 11 are diagrams for explaining a semiconductor device according to exemplary embodiments of the present inventive concept.
Figure 11:
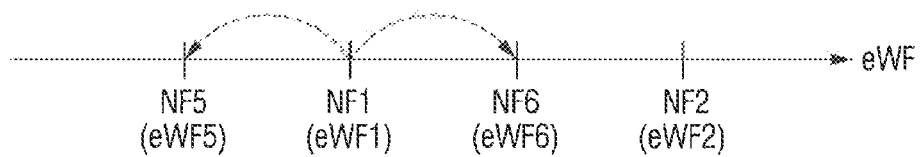

FIGS. 10 and 11 are diagrams for explaining a semiconductor device according to exemplary embodiments of the present inventive concept. For the sake of convenience, differences from FIGS. 5 and 6 will be mainly described below.

For reference, FIG. 10 is a cross-sectional view of a semiconductor device according to exemplary embodiments of the present inventive concept, and FIG. 11 is a diagram for explaining an effect of the semiconductor device of FIG. 10.

Referring to FIGS. 10 and 11, the semiconductor device according to the exemplary embodiments of the present inventive concept may include a first fin transistor. NF1, a second fin transistor NF2, a fifth fin transistor NF5 and a sixth fin transistor NF6 formed on a substrate 100.

Since a thickness t21 of a first work function layer 125 is different from a thickness t22 of a second work function layer 225, an effective work function eWF1 of a first gate stack 110 and an effective work function eWF2 of a second gate stack 210 may be different from each other. Moreover, the effective work function eWF1 of the first gate stack 110 and the effective work function eWF2 of the second gate stack 210 can be changed by changing the thickness of the work function layer.

In addition, each of an effective work function eWF5 of a fifth gate stack 510 and an effective work function eWF6 of a sixth gate stack 610 may be different from each other. Moreover, the effective work function eWF5 of the fifth gate stack 510 and the effective work function eWF6 of the sixth gate stack 610 can be changed by doping each of a fifth ferroelectric material layer 520 and a sixth ferroelectric material layer 620 with a work function material.

Therefore, the effective work function of a gate stack can be changed by doping a ferroelectric material layer with a work function material while changing the thickness of a work function layer.

In FIG. 11, a change in effective work function due to a change in the thickness of a work function layer is greater than a change in effective work function due to the doping of a work function material. However, the present inventive concept is not limited thereto.

In other words, the effective work function eWF6 of the sixth gate stack 610 including the sixth ferroelectric material layer 620 doped with the second work function material can be greater than or equal to the effective work function eWF2 of the second gate stack 210 including the second work function layer 225 with the increased thickness.

Figure 12:
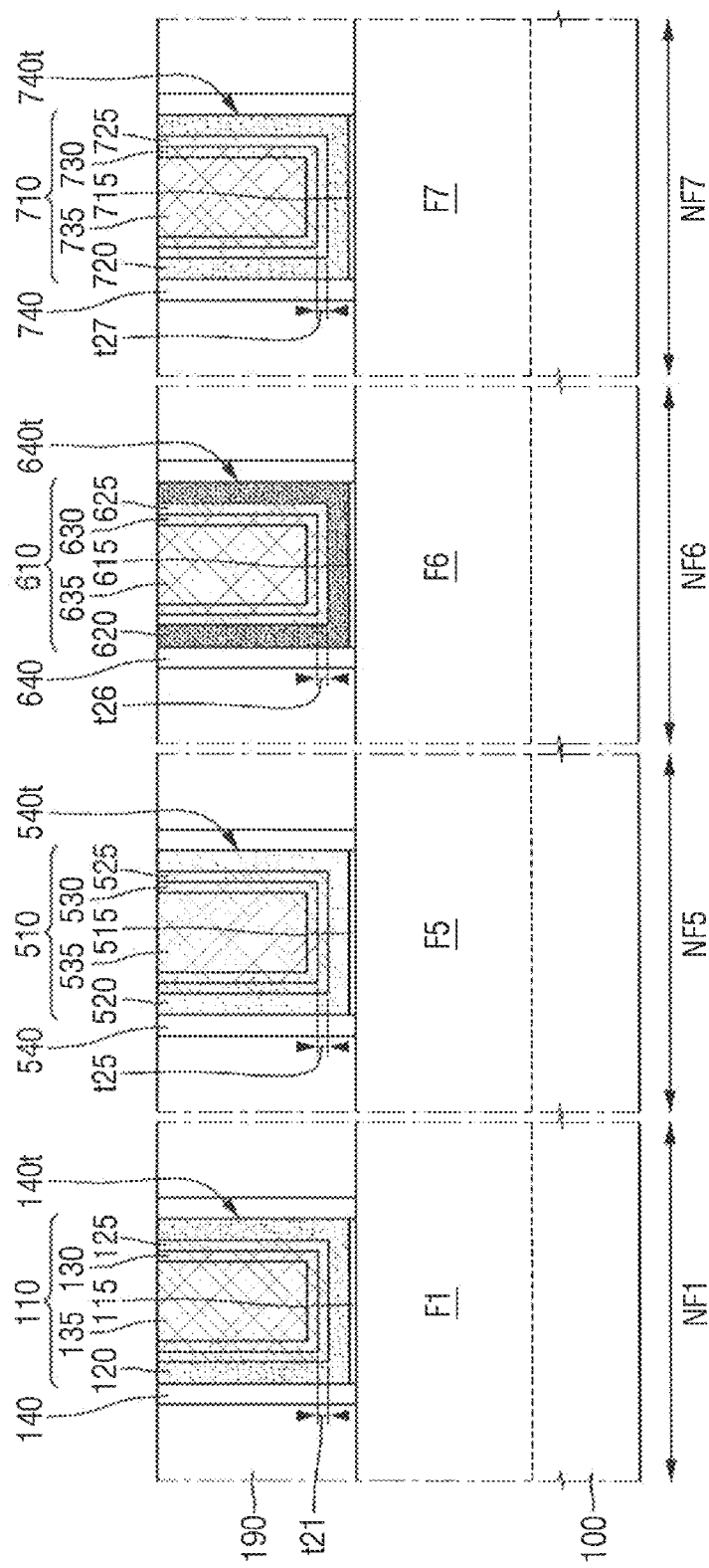
FIGS. 12 and 13 are diagrams for explaining a semiconductor device according to exemplary embodiments of the present inventive concept.
Figure 13:
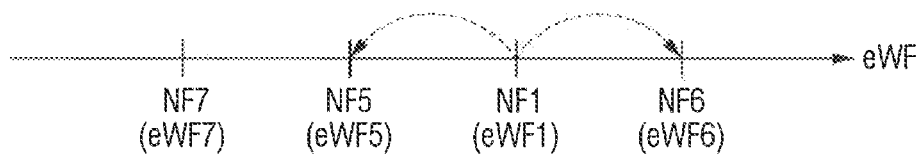

FIGS. 12 and 13 are diagrams for explaining a semiconductor device according to exemplary embodiments of the present inventive concept. For the sake of convenience, differences from FIGS. 5 and 6 will be mainly described below.

For reference, FIG. 12 is a cross-sectional view of a semiconductor device according to exemplary embodiments of the present inventive concept, and FIG. 13 is a diagram for explaining an effect of the semiconductor device of FIG. 12.

Referring to FIGS. 12 and 13, the semiconductor device according to the exemplary embodiments of the present inventive concept may include a first fin transistor NF1, a fifth fin transistor NF5, a sixth fin transistor NF6 and a seventh fin transistor NF7 formed on a substrate 100.

Since a first work function layer 125 and a seventh work function layer 725 include different materials, an effective work function eWF1 of a first gate stack 110 and an effective work function eWF7 of a seventh gate stack 710 can be changed. For example, the effective work function eWF7 of the seventh gate stack 710 can be less than the effective work function eWF1 of the first gate stack 110.

In addition, each of an effective work function eWF5 of a fifth gate stack 510 and an effective work function eWF6 of a sixth gate stack 610 can be changed by doping each of a fifth ferroelectric material layer 520 and a sixth ferroelectric material layer 620 with a work function material. For example, the effective work function eWF6 of the sixth gate stack 610 can be greater than the effective work function eWF5 of the fifth gate stack 510.

Therefore, the effective work function of a gate stack can be changed by doping a ferroelectric material layer with a work function material while changing the thickness of a work function layer.

In FIG. 13, a change in effective work function due to a change in the material of a work function layer is greater than a change in effective work function due to the doping of a work function material. However, the present inventive concept is not limited thereto.

In other words, the effective work function eWF5 of the fifth gate stack 510 including the fifth ferroelectric material layer 520 doped with the first work function material may be smaller than or equal to the effective work function eWF7 of the seventh gate stack 710 including the seventh work function layer 725 whose work function is smaller than that of the first work function layer 125.

Figure 14:
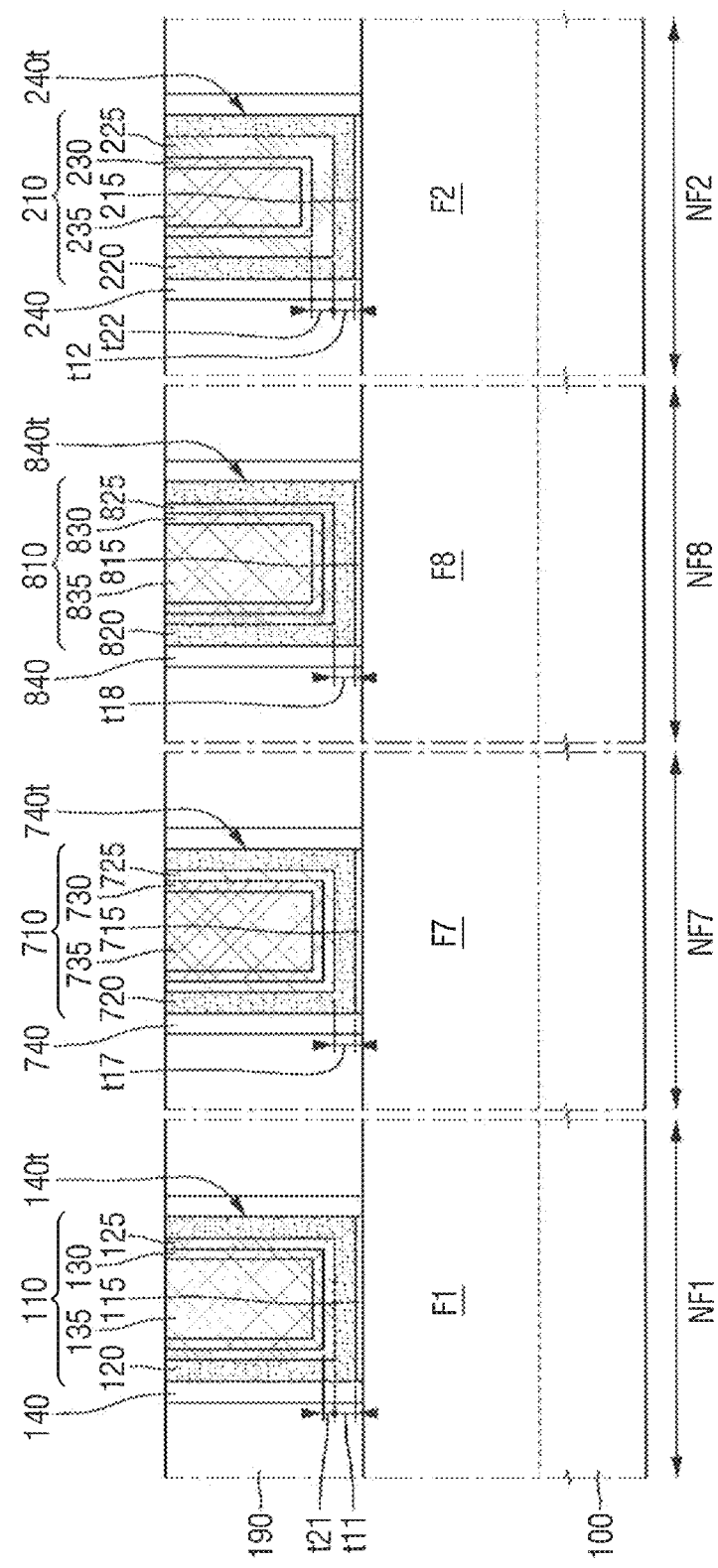
FIGS. 14 and 15 are diagrams for explaining a semiconductor device according to exemplary embodiments of the present inventive concept.
Figure 15:
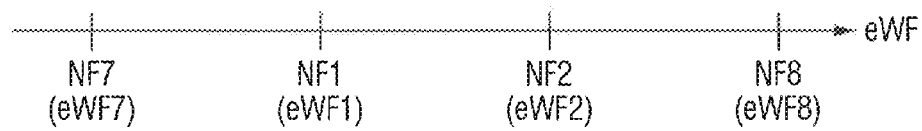

FIGS. 14 and 15 are diagrams for explaining a semiconductor device according to exemplary embodiments of the present inventive concept. For the sake of convenience, differences from FIGS. 7 and 8 will be mainly described below.

For reference, FIG. 14 is a cross-sectional view of a semiconductor device according to exemplary embodiments of the present inventive concept, and FIG. 15 is a diagram for explaining an effect of the semiconductor device of FIG. 14.

Referring to FIGS. 14 and 15, the semiconductor device according to the exemplary embodiments of the inventive concept may include a first fin transistor NF1, a second fin transistor NF2, a seventh fin transistor NF7 and an eighth fin transistor NF8 formed on a substrate 100.

Since a first work function layer 125 includes a different material from a seventh work function layer 725 and an eighth work function layer 825, an effective work function eWF1 of a first gate stack 110, an effective work function eWF7 of a seventh gate stack 710, and an effective work function eWF8 of an eighth gate stack 810 can be changed to be different from each other.

In addition, since a thickness t21 of the first work function layer 125 is different from a thickness t22 of a second work function layer 225, e.g., the thickness t21 is thinner than the thickness t22, each of the effective work function eWF1 of the first gate stack 110 and an effective work function eWF2 of a second gate stack 210 are different. Moreover, the effective work function eWF1 of the first gate stack 110 and an effective work function eWF2 of the second gate stack 210 can be changed by changing the thickness of the work function layer.

Therefore, the effective work function of a gate stack can be changed by changing the material of a work function layer while changing the thickness of the work function layer.

In FIG. 15, a change in effective work function due to a change in the material of a work function layer is greater than a change in effective work function due to a change in the thickness of the work function layer. However, the present inventive concept is not limited thereto.

In other words, the effective work function eWF2 of the second gate stack 210 including the second work function layer 225 with the increased thickness can be greater than or equal to an effective work function eWF8 of the eighth gate stack 810 including the eighth work function layer 825 whose work function is greater than that of the first work function layer 125.

Figure 16:
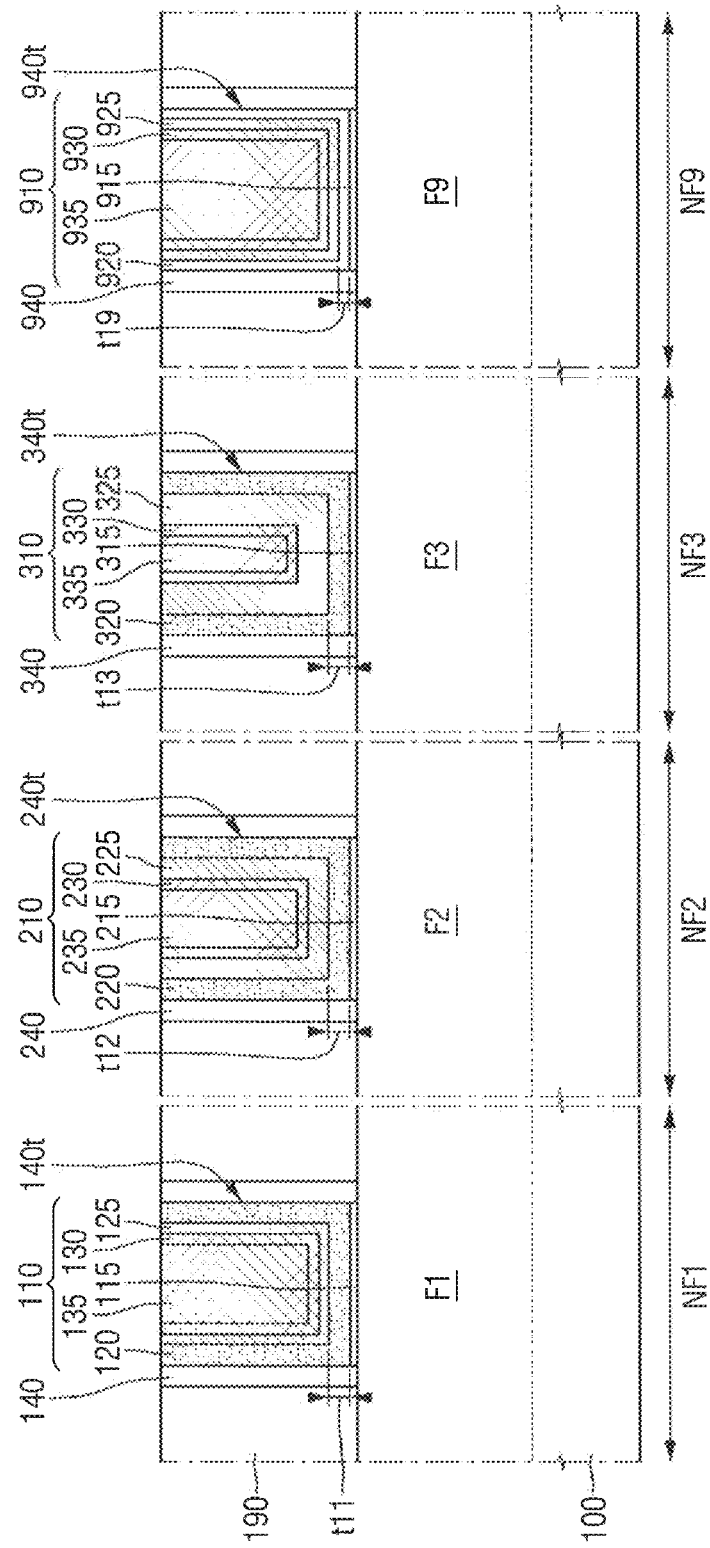
FIG. 16 is a cross-sectional view of a semiconductor device according to exemplary embodiments of the present inventive concept.

FIG. 16 is a cross-sectional view of a semiconductor device according to exemplary embodiments of the present inventive concept. For the sake of convenience, differences from FIGS. 1 through 3 will be mainly described below.

Referring to FIG. 16, the semiconductor device according to the exemplary embodiments of the present inventive concept may include a first fin transistor NF1, a second fin transistor NF2, a third fin transistor NF3 and a ninth fin transistor NF9 formed on a substrate 100.

For example, the ninth fin transistor NF9 is not an NCFET. The ninth fin transistor NF9 does not include a gate insulating layer having ferroelectric characteristics.

The ninth fin transistor NF9 may include a ninth fin pattern F9, a ninth gate stack 910, and ninth gate spacers 940. The ninth gate stack 910 is formed in a ninth gate trench 940t.

The ninth gate stack 910 may include a ninth interfacial layer 915, a high-k insulating layer 920, a ninth interposing conductive layer 930, and a ninth filling layer 935.

A first fin pattern F1 and the ninth fin pattern F9 may be, but are not necessarily, made of the same material to have the same thickness. A first interfacial layer 115 and the ninth interfacial layer 915 may be, but are not necessarily, made of the same material. A first interposing conductive layer 130 and the ninth interposing conductive layer 930 may be, but are not necessarily, made of the same material, and a first filling layer 135 and the ninth filling layer 935 may be, but are not necessarily, made of the same material.

The high-k insulating layer 920 may not have ferroelectric characteristics. Even if a material included in the high-k insulating layer 920 has the ferroelectric characteristics, the high-k insulating layer 920 may have a thickness so as not to exhibit the ferroelectric characteristics.

The high-k insulating layer 920 may include, but not necessarily, the same material as a first ferroelectric material layer 120. When the high-k insulating layer 920 includes the same material as the first ferroelectric material layer 120, a thickness t19 of the high-k insulating layer 920 is smaller than a thickness t11 of the first ferroelectric material layer 120.

A ninth work function layer 925 may be, but is not necessarily, the same as a first work function layer 125.

Exemplary embodiments of the present inventive concept provide a semiconductor device capable of realizing various threshold voltages in an NCFET including a gate dielectric layer having ferroelectric characteristics.

While the present inventive concept has been particularly shown and described with reference to exemplary embodiments thereof, it will be understood by those of ordinary skill in the art that various changes in form and details may be made thereto without departing from the spirit and scope of the present inventive concept as defined by the following claims.

What is claimed is:

1. A semiconductor device, comprising:
   a first transistor which comprises a first gate stack on a substrate, wherein the first transistor includes a first nanosheet; and
   a second transistor which comprises a second gate stack on the substrate, wherein the second transistor includes a second nanosheet,
   wherein the first gate stack comprises an interfacial layer disposed on the substrate, a first ferroelectric material layer disposed on the interfacial layer, a high dielectric constant insulating layer and a conductive layer formed between the interfacial layer and the first ferroelectric material layer, a first work function layer disposed on the first ferroelectric material layer and a first upper gate electrode disposed on the first work function layer,
   wherein a thickness of the first ferroelectric material layer is greater than a thickness of the first work function layer,
   wherein the second gate stack comprises a second ferroelectric material layer disposed on the substrate, a second work function layer disposed on the second ferroelectric material layer and a second upper gate electrode disposed on the second work function layer,
   wherein the first work function layer comprises the same material as the second work function layer,
   wherein the semiconductor device further comprises a third transistor which comprises a third gate stack on the substrate, wherein the third transistor includes a third nanosheet,
   wherein the third gate stack comprises a third ferroelectric material layer disposed on the substrate, a third work function layer contacting the third ferroelectric material layer and a third upper gate electrode disposed on the third work function layer, and
   wherein a thickness of the third ferroelectric material layer is less than a thickness of the third work function layer.

2. The semiconductor device of claim 1, wherein the first ferroelectric material layer comprises the same material as the second ferroelectric material layer, and the first work function layer is thinner than the second work function layer.

3. The semiconductor device of claim 2, wherein an effective work function of the first gate stack is smaller than an effective work function of the second gate stack, and the first work function layer comprises titanium nitride.

4. The semiconductor device of claim 2, wherein the third work function layer comprises the same material as the first work function layer, the first ferroelectric material layer and the third ferroelectric material layer comprise a metal oxide, the third ferroelectric material layer comprises a work function material, and the first ferroelectric material layer does not comprise the work function material.

5. The semiconductor device of claim 1, wherein the thickness of the first work function layer is equal to a thickness of the second work function layer, the first ferroelectric material layer and the second ferroelectric material layer comprise a metal oxide, the first ferroelectric material layer comprises a work function material, and the second ferroelectric material layer does not comprise the work function material.

6. The semiconductor device of claim 5, wherein the metal oxide comprises hafnium (Hf), and the work function material comprises lanthanum (La), magnesium (Mg) or yttrium (Y).

7. The semiconductor device of claim 5, wherein the metal oxide comprises hafnium (Mt), and the work function material comprises aluminum (Al), titanium (Ti) or niobium (Nb).

8. The semiconductor device of claim 5, wherein the third work function layer comprises the same material as the second work function layer, the third work function layer is thicker than the second work function layer, the third ferroelectric material layer comprises the metal oxide, and the third ferroelectric material layer does not comprise the work function material.

9. The semiconductor device of claim 1, wherein each of the first transistor and the second transistor is a negative capacitance field-effect transistor (NCFET).

10. A semiconductor device, comprising:
    a first transistor which comprises a first gate stack on a substrate, wherein the first transistor includes a first nanosheet; and a second transistor which comprises a second gate stack on the substrate, wherein the second transistor includes a second nanosheet, wherein the first gate stack comprises an interfacial layer disposed on the substrate, a first ferroelectric material layer disposed on the interfacial layer, a high dielectric constant insulating layer and a conductive layer formed between the interfacial layer and the first ferroelectric material layer, a first work function layer contacting the first ferroelectric material layer and a first upper gate electrode disposed on the first work function layer, wherein a thickness of the first ferroelectric material layer is greater than a thickness of the first work function layer, wherein the second gate stack comprises a second ferroelectric material layer disposed on the substrate, a second work function layer contacting the second ferroelectric material layer and a second upper gate electrode disposed on the second work function layer, wherein the first ferroelectric material layer and the second ferroelectric material layer comprise the same material, wherein the thickness of the first ferroelectric material layer is equal to a thickness of the second ferroelectric material layer, wherein the semiconductor device further comprises a third transistor which comprises a third gate stack on the substrate, wherein the third transistor includes a third nanosheet, wherein the third gate stack comprises a third ferroelectric material layer disposed on the substrate, a third work function layer contacting the third ferroelectric material layer and a third upper gate electrode disposed on the third work function layer, and wherein a thickness of the third ferroelectric material layer is less than a thickness of the third work function layer.

11. The semiconductor device of claim 10, wherein the first work function layer comprises the same material as the second work function layer, and the first work function layer is thinner than the second work function layer.

12. The semiconductor device of claim 11, wherein the first work function layer comprises titanium nitride.

13. The semiconductor device of claim 10, wherein the first work function layer comprises a different material from the second work function layer.

14. The semiconductor device of claim 13, wherein the first work function layer comprises titanium carbonitride (TiCN), titanium nitride (TiN) or tungsten carbonitride (WCN), and the second work function layer comprises platinum (Pt), iridium (Ir), ruthenium (Ru), molybdenum nitride (MoN) or molybdenum (Mo).

15. The semiconductor device of claim 13, wherein the first work function layer comprises titanium carbonitride (TiCN), titanium nitride (TiN) or tungsten carbonitride (WCN and the second work function layer comprises tungsten (W), titanium silicon nitride (TiSiN), titanium aluminum nitride (TiAlN), titanium boron nitride (TiBN) or tantalum nitride (TaN).

16. The semiconductor device of claim 13, wherein the third work function layer comprises the same material as the first work function layer, the third work function layer is thicker than the first work function layer, and the third ferroelectric material layer comprises the same material as the first ferroelectric material layer.

17. The semiconductor device of claim 10, wherein each of the first transistor and the second transistor is a negative capacitance field-effect transistor (NCFET).

18. A semiconductor device, comprising:
a first negative capacitance field-effect transistor (NCFET) which comprises a first gate stack on a substrate, wherein the first NCFET includes a first nanosheet; and
a second NCFET which comprises a second gate stack on the substrate, wherein the second NCFET includes a second nanosheet, wherein the first gate stack comprises a first interfacial layer disposed on the substrate, a first gate insulating layer disposed on the first interfacial layer, a high dielectric constant insulating layer and a conductive layer formed between the interfacial layer and the first gate insulating layer, a first work function layer disposed on the first gate insulating layer to contact the first gate insulating layer and a first tipper gate electrode disposed on the first work function layer, wherein a thickness of the first gate insulating layer is greater than a thickness of the first work function layer, wherein the second gate stack comprises a second interfacial layer disposed on the substrate, a second gate insulating layer disposed on the second interfacial layer, a second work function layer disposed on the second gate insulating layer to contact the second gate insulating layer and a second upper gate electrode disposed on the second work function layer, wherein a structure of the first gate stack is different from a structure of the second gate stack, wherein the first work function layer comprises the same material as the second work function layer, and the thickness of the first work function layer is different from a thickness of the second work function layer, wherein the semiconductor device further comprises a third NCFET which comprises a third gate stack on the substrate, wherein the third NCFET includes a third nanosheet, wherein the third gate stack comprises a third gate insulating layer disposed on the substrate, a third work function layer contacting the third gate insulating layer and a third upper gate electrode disposed on the third work function layer, and wherein a thickness of the third gate insulating layer is less than a thickness of the third work function layer.

19. The semiconductor device of claim 18, wherein the first gate insulating layer comprises the same material as the second gate insulating layer, the thickness of the first gate insulating layer is equal to a thickness of the second gate insulating layer.

20. The semiconductor device of claim 18, wherein the first gate insulating layer comprises the same metal oxide as the second gate insulating layer, the first gate insulating layer comprises a work function material, and the second gate insulating layer does not comprise the work function material.

* * * * *